US00RE40011E

(19) United States
(12) Reissued Patent
Tran et al.

(10) Patent Number: US RE40,011 E
(45) Date of Reissued Patent: Jan. 22, 2008

(54) SYSTEM FOR COUPLING PROGRAMMABLE LOGIC DEVICE TO EXTERNAL CIRCUITRY WHICH SELECTS A LOGIC STANDARD AND USES BUFFERS TO MODIFY OUTPUT AND INPUT SIGNALS ACCORDINGLY

(75) Inventors: Nghia Tran, Milpitas, CA (US); Ying Xuan Li, Cupertino, CA (US); Janusz Balicki, San Jose, CA (US); John Costello, Los Altos, CA (US)

(73) Assignee: Altera Corporation, San Jose, CA (US)

(21) Appl. No.: 10/084,757

(22) Filed: Oct. 19, 2001

Related U.S. Patent Documents

Reissue of:
(64) Patent No.: 5,970,255
Issued: Oct. 19, 1999
Appl. No.: 08/543,649
Filed: Oct. 16, 1995

(51) Int. Cl.
*H03K 19/173* (2006.01)

(52) U.S. Cl. ..... 326/46; 326/40
(58) Field of Classification Search ..... 326/38, 326/39, 40, 41, 44, 45, 46, 47, 49, 50, 82
See application file for complete search history.

(56) References Cited

U.S. PATENT DOCUMENTS

| | | | | |
|---|---|---|---|---|
| 4,032,800 | A | 6/1977 | Dröscher et al. | 307/296 |
| 4,472,647 | A | 9/1984 | Allgood et al. | 307/475 |
| 4,527,079 | A | 7/1985 | Thompson | 307/475 |
| 4,609,986 | A | 9/1986 | Hartmann et al. | |
| 4,617,479 | A | 10/1986 | Hartmann et al. | |
| 4,625,129 | A | 11/1986 | Ueno | 307/446 |
| 4,677,318 | A | 6/1987 | Veenstra | |
| 4,713,792 | A | 12/1987 | Hartmann et al. | |
| 4,774,421 | A | 9/1988 | Hartmann et al. | |
| 4,783,607 | A | 11/1988 | Hsieh | 307/475 |
| 4,791,312 | A | 12/1988 | Weick | 307/264 |
| 4,797,583 | A | 1/1989 | Ueno et al. | 307/475 |
| 4,820,937 | A | 4/1989 | Hsieh | 307/475 |
| 4,871,930 | A | 10/1989 | Wong et al. | |
| 4,879,481 | A | 11/1989 | Pathak et al. | 307/465 |
| 4,899,067 | A | 2/1990 | So et al. | |
| 4,912,342 | A | 3/1990 | Wong et al. | |
| 4,933,575 | A | 6/1990 | Aso | 307/465 |
| 4,970,410 | A | 11/1990 | Matsushita et al. | 307/303 |
| 4,972,470 | A | 11/1990 | Farago | |

(Continued)

FOREIGN PATENT DOCUMENTS

| | | |
|---|---|---|
| EP | 0 358 501 | 9/1989 |

(Continued)

OTHER PUBLICATIONS

B.A. Chappell, et al., "Fast CMOS ECL Receivers with 100mV Worst–Case Sensitivity" *IEEE Journal of Solid–State Circuits*, vol. 23, No. 1, Feb. 1988, pp. 59–66.

(Continued)

*Primary Examiner*—Daniel D. Chang
(74) *Attorney, Agent, or Firm*—Ropes & Gray LLP; Robert R. Jackson; Chia-Hao La

(57) ABSTRACT

A programmable input/output device for use with a programmable logic device (PLD) is presented comprising an input buffer, an output buffer and programmable elements. The programmable elements may be programmed to select a logic standard for the input/output device to operate at. For instance, a given set of Select Bits applied to the programmable elements may select TTL logic, in which case the input and output buffers would operate according to the voltage levels appropriate for TTL logic (e.g., 0.4 volts to 2.4 volts). For a different set of Select Bits, the GTL logic standard would be applied (e.g., 0.8 volts to 1.2 volts). The invention enables a single PLD to be used in conjunction with various types of external circuitry.

39 Claims, 5 Drawing Sheets

U.S. PATENT DOCUMENTS

| | | | | | |
|---|---|---|---|---|---|
| 4,975,602 | A | | 12/1990 | Nhu | 307/475 |
| 4,987,319 | A | | 1/1991 | Kawana | 307/465 |
| 4,987,578 | A | | 1/1991 | Akins et al. | |
| 4,994,691 | A | | 2/1991 | Naghshineh | 307/475 |
| 4,999,529 | A | | 3/1991 | Morgan, Jr. et al. | 307/475 |
| 5,003,200 | A | | 3/1991 | Sakamoto | |
| 5,023,488 | A | | 6/1991 | Gunning | 307/475 |
| 5,028,821 | A | | 7/1991 | Kaplinsky | 307/465 |
| 5,034,634 | A | | 7/1991 | Yamamoto | 307/465 |
| 5,101,122 | A | | 3/1992 | Shinonara | |
| 5,121,006 | A | | 6/1992 | Pedersen | |
| 5,121,359 | A | | 6/1992 | Steele | |
| 5,132,573 | A | | 7/1992 | Tsuru et al. | 307/475 |
| 5,151,619 | A | | 9/1992 | Austin et al. | 307/475 |
| 5,220,214 | A | | 6/1993 | Pedersen | |
| 5,235,219 | A | | 8/1993 | Cooperman et al. | 307/443 |
| 5,243,623 | A | * | 9/1993 | Murdock | 375/7 |
| RE34,444 | E | | 11/1993 | Kaplinsky | |
| 5,260,610 | A | | 11/1993 | Pedersen et al. | |
| 5,260,611 | A | | 11/1993 | Cliff et al. | |
| 5,282,271 | A | | 1/1994 | Hsieh et al. | 395/275 |
| 5,300,835 | A | | 4/1994 | Assar et al. | 307/475 |
| 5,311,080 | A | | 5/1994 | Britton et al. | 307/465 |
| 5,317,210 | A | | 5/1994 | Patel | 307/465 |
| 5,331,220 | A | * | 7/1994 | Pierce et al. | 307/475 |
| 5,332,935 | A | | 7/1994 | Shyu | 307/475 |
| 5,350,954 | A | | 9/1994 | Patel | |
| RE34,808 | E | | 12/1994 | Hsieh | 326/71 |
| 5,371,422 | A | | 12/1994 | Patel et al. | |
| 5,374,858 | A | | 12/1994 | Elmer | 327/333 |
| 5,412,599 | A | | 5/1995 | Daniele et al. | |
| 5,426,744 | A | | 6/1995 | Sawase et al. | |
| 5,428,305 | A | | 6/1995 | Wong et al. | 326/75 |
| 5,428,800 | A | | 6/1995 | Hsieh et al. | 395/775 |
| 5,483,178 | A | | 1/1996 | Costello et al. | |
| 5,534,794 | A | | 7/1996 | Moreland | 326/63 |
| 5,534,798 | A | | 7/1996 | Phillips et al. | 326/108 |
| 5,581,199 | A | * | 12/1996 | Pierce et al. | 326/41 |
| 5,589,783 | A | | 12/1996 | McClure | 326/71 |
| 5,590,305 | A | | 12/1996 | Terrill et al. | |
| 5,600,267 | A | | 2/1997 | Wong et al. | |
| 5,612,637 | A | | 3/1997 | Shay et al. | 326/86 |
| 5,732,407 | A | | 3/1998 | Mason et al. | |

FOREIGN PATENT DOCUMENTS

| | | |
|---|---|---|
| EP | 0 426 283 B1 | 5/1991 |
| EP | 0 544 461 A2 | 6/1993 |
| EP | 0 608 515 A1 | 8/1994 |
| EP | 0 616 431 B1 | 9/1994 |
| JP | 01-274512 | 11/1989 |
| JP | 02-013124 | 1/1990 |
| JP | 02-161820 | 6/1990 |
| JP | 04-223617 | 8/1992 |

OTHER PUBLICATIONS

F. Claude, "Cross–boundry PLDs", Semiconductor Currents, Jun. 1991, pp. 9–10.

Carlo Guardiani, et al., "Applying a submicron mismatch model to practical IC design" *IEEE 1994 Custom Integrated Circuits Conference*, 1994, pp. 297–300.

Bill Gunning, et al., "A CMOS Low–Voltage–Swing Transmission–Line Transceiver" *IEEE International Solid–State Circuits Conference*, 1992, pp. 58–59.

Andrew Haines, "Field–programmable gate array with non–volatile configuration", *Microprocessors and Microsystems*, vol. 13, No. 5, Jun. 1989, pp. 305–312.

H.I. Hanafi, et al., "Design and Characterization of CMOS Off–Chip Driver/Receiver with Reduced Power–Supply Disturbance", *IEEE Journal of Solid–State Circuits*, vol. 27, No. 5, May 1992, pp. 783–785.

"IEEE 1194.1 BTL–Enabling Technology for High Speed Bus Applications", Jun. 1992, pp. 1–5.

K. Knack, "Debunking High–Speed PCB Design Myths", *ASIC & EDA*, Jul. 1993, pp. 12–26.

M.J.M. Pelgrom, et al., "A 3/5 V Compatible I/O Buffer", *IEEE Journal of Solid–State Circuits*, vol. 30, No. 7, Jul. 1995, pp. 823–825.

M.J.M. Pelgrom, et al., "Matching Properties of MOS Transistor", *IEEE Journal of Solid–State Circuits*, vol. 24, No. 5, Oct. 1989, pp. 1433–1440.

B. Prince, et al., "ICS going on a 3–V diet", *IEEE Spectrum*, May 1992, pp. 23–25.

R. Senthinathan, "Application Specific CMOs Output Driver Circuit Design Techniques to Reduce Simultaneous Switching Noise", *IEEE Journal of Solid–State Circuits Conference*, vol. 28, No. 12, Dec. 1993, pp. 1383–1388.

R. Senthinathan, Simultaneious Switching Ground Noise Calculation for Packaged CMOs Devices, *IEEE Journal of Solid–State Circuits Conference*, vol. 26, No. 11, Nov. 1991, pp. 1724–1728.

M. Ueda, "A 3.3V ASIC for Mixed Voltage Applications with Shut Down Mode", *IEEE Custom Integrated Circuits Conference*, 1993, pp. 25.5.1–25.5.4.

S. H. Voldman, "ESD Protections in a Mixed Voltage Interface and Multi–Rail Disconnected Power Grid Environment in 0.50 and 0.25 Channel Length CMOS Technologies", *EOS/ESD Symposium*, pp. 3.4.1–3.4.10, 1994.

T.T. Vu., "A Gallium Arsenide SDFL Gate Array with On–chip RAM", *IEEE Journal of Solid–State Circuits*, vol. SC–19, No. 1, Feb. 1984, pp. 10–22.

J. Williams, "Mixing 3–V and 5–V Ics", *IEEE Spectrum*, Mar. 1993, pp. 40–42.

A. L. Roberts, "Session XIX: High Density SRAMs", *IEEE international Solid–State Circuits Conference*, Feb. 1987, pp. 252–254.

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, Chapters VI and IX, pp. 229–254 and 369–422.

* cited by examiner

SYSTEM FOR COUPLING PROGRAMMABLE LOGIC DEVICE TO EXTERNAL CIRCUITRY WHICH SELECTS A LOGIC STANDARD AND USES BUFFERS TO MODIFY OUTPUT AND INPUT SIGNALS ACCORDINGLY

Matter enclosed in heavy brackets [ ] appears in the original patent but forms no part of this reissue specification; matter printed in italics indicates the additions made by reissue.

BACKGROUND OF THE INVENTION

This invention relates to programmable logic devices ("PLDs"), and more particularly to a new architecture for the input/output (I/O) circuitry which couples the PLDs to external circuitry.

Programmable logic devices are integrated circuits which are able to implement combinational and/or sequential digital functions which may be defined by a designer and programmed into the device. Thus, PLDs may be configured by a user to implement any Boolean expression or registered function with built-in logic structures. Once a PLD is configured, the user must connect the PLD to external circuitry which provides input signals to, and receives output signals from, the PLD.

One deficiency of conventional PLDs and their I/O circuitry is that each PLD must be configured to operate with specific external circuitry. For example, if a user utilizes Transistor-to-Transistor Logic (TTL) or CMOS external circuitry, the PLD must be configured to provide the appropriate drive signals. However, the selection of open drain logic may require different drive parameters and thus, a different PLD, even though the basic PLD is substantially the same. This deficiency is even more apparent in view of the programmable nature of PLDs and the flexibility provided to the end users.

Further, the nature of PLDs, as semiconductor devices, is that they are susceptible to a wide range of potential hazards, such as electrostatic discharge (ESD). To avoid these potential problems, care must be taken in connecting the PLD pins to external circuitry. Any pins which are used as input pins should preferably be driven by an active source (including bi-directional pins during input operations). Additionally, unused pins are typically tied to ground to avoid the potential of additional DC current and noise being introduced into the circuits.

Output loading of the PLD I/O pins is typically resistive and/or capacitive. Resistive loading exists where the device output sinks or sources a current during steady-state operation (e.g., TTL inputs, terminated buses, and discrete bipolar transistors). Capacitive loading typically occurs from packaging and printed circuit board traces. Further, an important design consideration of the interface between the PLD and external circuitry is that the target device can supply both the current and speed necessary for the given loads.

Various attempts have also been made at providing interface circuitry that operates at lower power levels, for example, the Gunning Transistor Logic (GTL) interface described in Gunning U.S. Pat. No. 5,023,488. GTL interface drivers typically operate with a voltage swing on the order of about 0.8 volts to 1.2 volts, which are intended to drive a CMOS binary communications bus. Another interface, High-Speed Transistor Logic (HSTL) typically operates with a voltage swing of about a predetermined voltage plus 0.050 volts to the predetermined voltage minus 0.050 volts and at relatively higher switching frequencies than GTL (for terminated HSTL, the predetermined voltage is the termination voltage, while non-terminated HSTL uses a reference voltage).

One deficiency of Gunning and other known driver circuitry is the limited scope with which the circuitry may be used. A PLD having GTL drivers must interface with a GTL bus. A PLD having TTL drivers must interface with a TTL bus or discrete TTL components. A PLD having HSTL drivers must interface with a HSTL bus or discrete HSTL components.

In view of the foregoing, it would be desirable to be able to provide an I/O architecture which provides the capability to drive multiple logic standards.

It would also be desirable to be able to provide an I/O architecture having the capability to selectively drive any one of multiple logic standards.

It would further be desirable to be able to provide an I/O architecture which may be programmed by a user to select any one of several logic standards, such that a single PLD may be used with external circuitry that operates at different logic levels.

SUMMARY OF THE INVENTION

It is an object of this invention to provide an I/O architecture which provides the capability to drive multiple logic standards.

It is a further object of this invention to provide an I/O architecture having the capability to selectively drive any one of multiple logic standards.

It is a further object of this invention to provide an I/O architecture which may be programmed by a user to select any one of several logic standards, such that a single PLD may be used with external circuitry that operates at different logic levels.

These and other objects are accomplished in accordance with the principles of the present invention by providing an I/O architecture which includes programmable I/O buffers that interface with various different logic standards. In a preferred embodiment of the present invention, programmable I/O devices are provided which interface with TTL, CMOS, open drain, GTL and HSTL (both terminated and non-terminated) logic standards. Those skilled in the art will understand that other logic standards, both those presently available and others still to be developed, may be incorporated into I/O circuits such as those described herein without departing from the scope of the present invention.

The preferred embodiment of the present invention provides a programmable logic circuit having four states (i.e., two bits) which are correspond to voltage levels representative of various logic standards. By adding an additional bit to the logic circuit and additional driving circuitry, additional logic standards may be supported.

BRIEF DESCRIPTION OF THE DRAWINGS

The above and other objects and advantages of the invention will be apparent upon consideration of the following detailed description, taken in conjunction with the accompanying drawings, in which like reference numerals refer to like parts throughout, and in which.

DETAILED DESCRIPTION OF THE INVENTION

Figure 1:
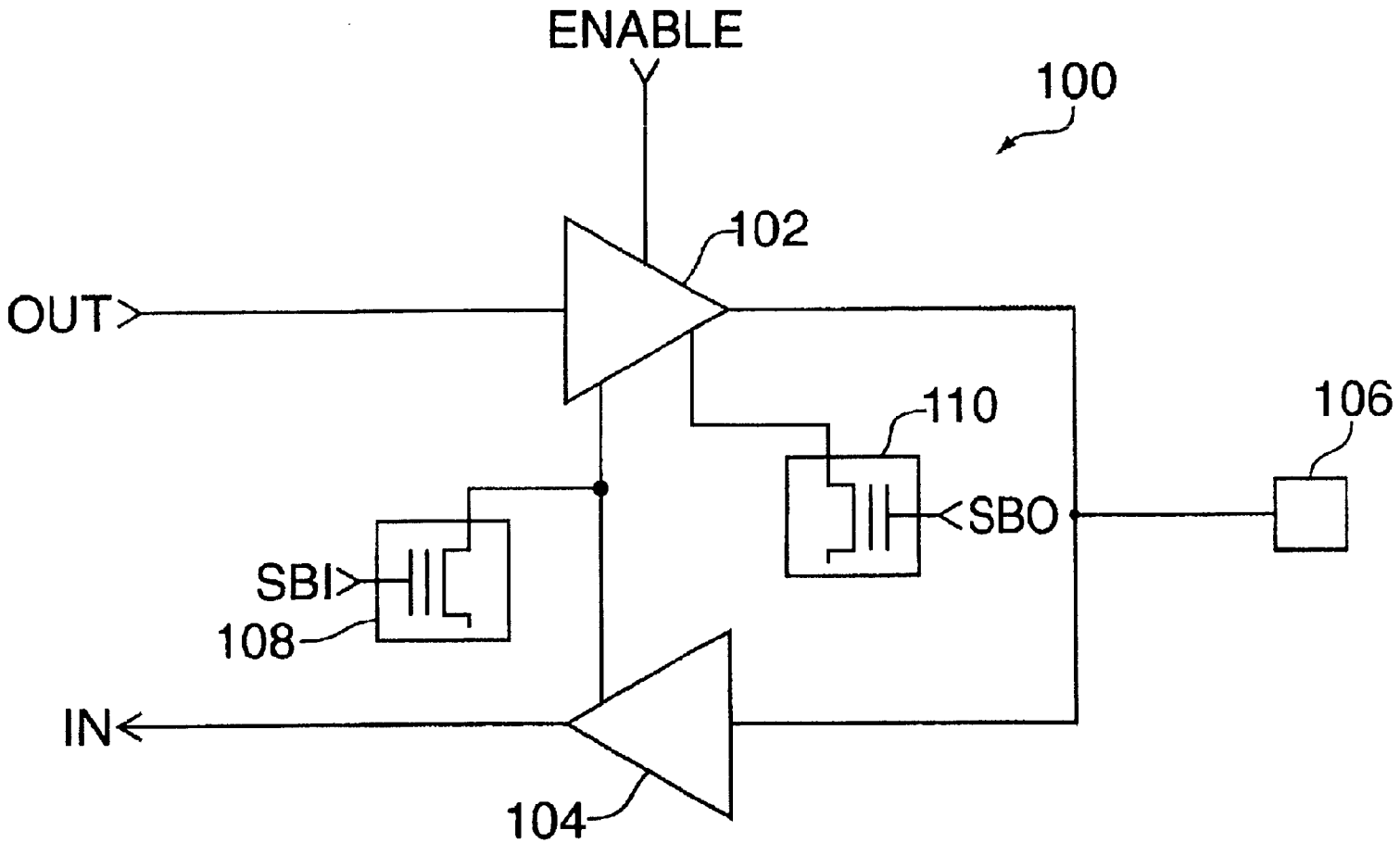
FIG. 1 is a schematic block diagram of an illustrative embodiment of an input/output circuit incorporating principles of the present invention.

FIG. 1 shows a schematic block diagram of a programmable input/output (I/O) circuit 100 which incorporates principles of the present invention. I/O circuit 100 includes output driver 102, input driver 104, I/O pad 106, and programmable elements 108 and 110. Output driver 102, which has an input terminal to receive output signals from a programmable logic device (PLD) (not shown), provides an output signal (OUT) to I/O pad 106 at an appropriate voltage level that corresponds to a selected logic standard. Additionally, output driver 102 has three control lines which receive signals ENABLE, SB0 (Select Bit 0), and SB1 (Select Bit 1).

Input driver 104, which has an input terminal to receive signals from I/O pad 106 and output buffer 102, provides input signals to the PLD at the appropriate level of voltage, regardless of the voltage level of the signal receive on the input terminal. In addition, input driver 104 also receives control signal SB1 from programmable element 108. Programmable elements 108 and 110 may be of any variety of memory cells. For example, elements 108 and 110 may be SRAM (static random access memory), EPROM (erasable programmable read-only memory), EEPROM (electrically erasable programmable read-only memory), or antifuses.

For convenience, simplicity and to reduce chip area, it is preferable that elements 108 and 110 be formed from the same variety of programmable elements as the PLD to which they are attached. Thus, if the PLD utilizes EEPROM elements (such as in the MAX 7000 family of PLDs available from Altera Corporation, San Jose, Calif.), each I/O circuit 100 should also include EEPROM elements for programmable elements 108 and 110. Further, while such a configuration is preferable, it is not a requirement of the present invention (i.e., a PLD utilizing EEPROMs may be configured with I/O circuits 100 utilizing SRAM elements).

The operation of I/O circuit 100 depends on the status of programmable elements 108 and 110. For a given set of programmable bits (i.e., setting the status of elements 108 and 110), output driver 102 and input driver 104 are configured to convert PLD voltage levels to voltage levels corresponding to the selected logic standard. Further, output driver 102 does not change its output voltage levels until an ENABLE signal is received on the appropriate control line, as described more fully below. In contrast to output driver 102, input driver 104 adjusts the voltage levels it operates with as soon as signal SB1 changes.

In the configuration shown in FIG. 1, where only two control bits are used (i.e., SB0 and SB1), there are four different sets of voltage levels which may be selected. Each voltage level corresponds to one or more of the appropriate voltages necessary to drive devices in accordance with a given logic standard.

For example, one possible I/O configuration for a given set of possible values of programmable elements 108 and 110 is given in the following Table 1:

TABLE 1

| SB1 | SB0 | Logic Standard Voltages |
|---|---|---|
| 0 | 0 | TTL/CMOS |
| 0 | 1 | Open Drain |
| 1 | 0 | GTL/HSTL (non-terminated) |
| 1 | 1 | GTL/HSTL (terminated) |

Thus, for example, if signals SB1 and SB0 are both set provide a logic low, output driver 102 and input driver 104 are configured to operate with TTL/CMOS voltage levels in interfacing with I/O pad 106.

Figure 2:
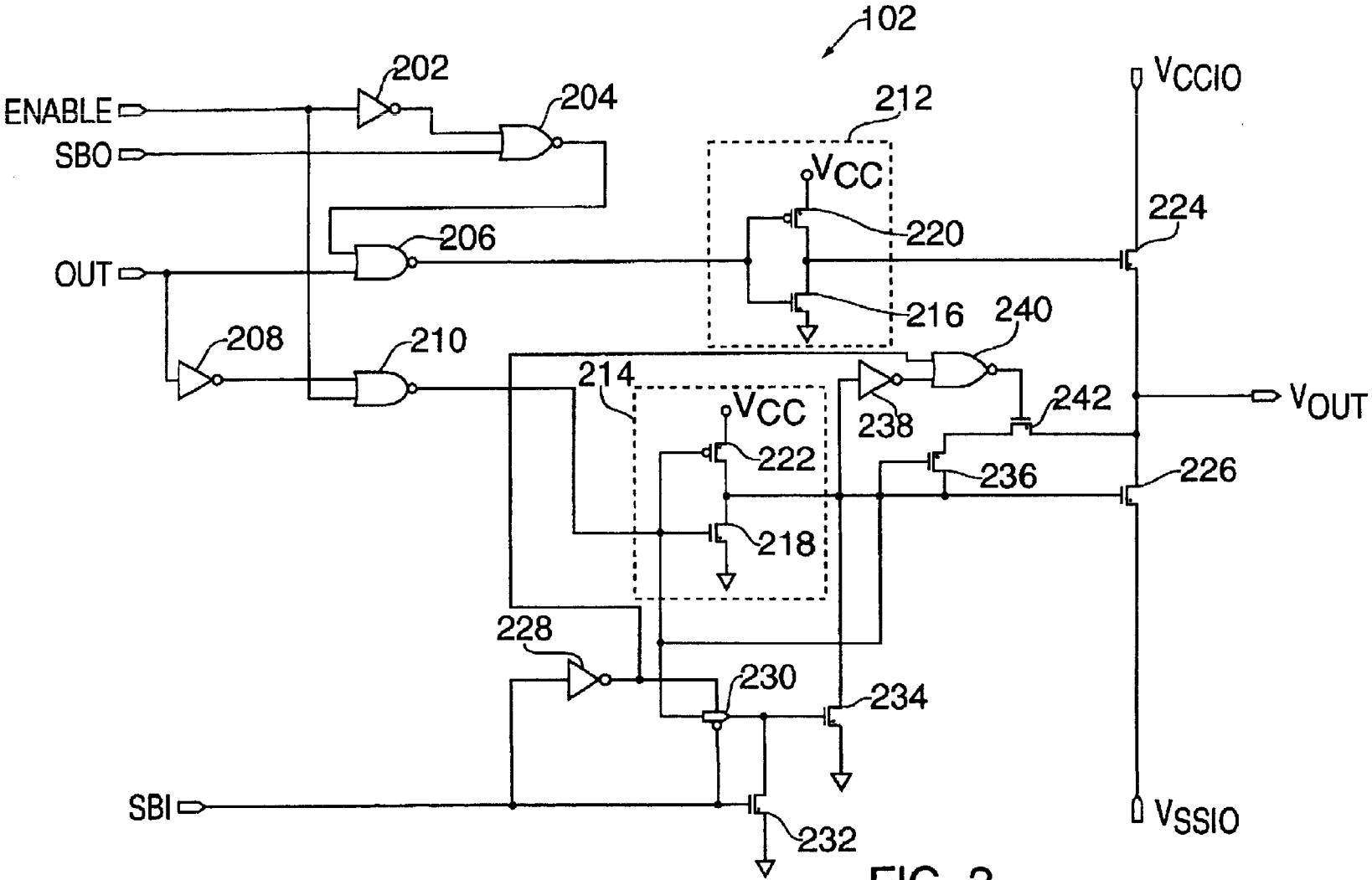
FIG. 2 is a schematic diagram of a programmable output buffer of the input/output circuit of FIG. 1, constructed in accordance with the principles of the present invention.

FIG. 2 shows a schematic circuit diagram of one embodiment of output driver 102 of FIG. 1. Output driver 102 includes inverter 202, which is adapted to receive the ENABLE signal and NOR gate 204, which receives the inverted ENABLE signal from inverter 202 and signal SB0 from element 110 (of FIG. 1). The output of NOR gate 204 is provided as one input to NAND gate 206, while the OUT signal is provided as the other input. Additionally, the OUT signal is inverted by inverter 208 and provided as one input to NAND gate 210, while the ENABLE signal is the other input signal.

The output of NAND gate 206 is provided to inverter 212, while the output of NAND gate 210 is provided to inverter 214. Inverters 212 and 214 are preferably both CMOS inverters which are formed by fabricating an n-channel MOSFET and a p-channel MOSFET with merged floating regions, as is well known in the art. Thus, inverters 212 and 214 are formed by n-channel MOSFETs 216 and 218, respectively, and p-channel MOSFETs 220 and 222, respectively. The outputs of inverters 212 and 214 are coupled to n-channel MOSFETs 224 and 226, respectively.

Signal SB1 is provided to inverter 228, whose output is coupled to transmission gate 230. Signal SB1 is also coupled to the gate of n-channel MOSFET 232. The input of transmission gate 230 is coupled to the output of NAND gate 210, while the output of gate 230 is coupled to the gate of n-channel MOSFET 234. MOSFET 234 is used to adjust the trip point of inverter 214. The output of NAND gate 210 is also coupled to the gate of n-channel MOSFET 236.

Inverter 214 provides an input signal to inverter 238 that is inverted and supplied as one input to NOR gate 240. The other input for NOR gate 240 is the inverted SB1 signal output from inverter 228. NOR gate 240 drives the gate of n-channel MOSFET 242, which has its drain and source regions connected between MOSFET 236 and the output terminal of output driver 102 (designated as $V_{OUT}$).

Output driver 102, which is active high (as described below), operates as follows. When ENABLE is low, the output of inverter 202 is high so that NOR gate 204 provides a low signal. The low signal is input to NAND gate 206, which produces a high signal to inverter 212. Inverter 212 inverts the high signal to drive the gate of n-channel MOSFET 224 with a low signal, which keeps MOSFET 224 turned off. At the same time, the low ENABLE signal is also provided as an input to NAND gate 210, which produces a high signal to inverter 214.

Inverter 214 inverts the high signal to drive the gate of n-channel MOSFET 226 with a low signal, which keeps MOSFET 226 turned off. Because both MOSFETs 224 and 226 are turned off, irrespective of signals SB1 and SB0, signal OUT is not passed to $V_{OUT}$. Thus, when ENABLE is low, output driver 102 is inactive.

Output driver 102 is turned on when ENABLE is set high. The logic standard applied by output driver 102 is determined by the status of Select Bits SB1 and SB0. The high ENABLE signal is input to inverter 202 and NAND gate 210, which potentially activates NOR gate 204 and NAND gate 210. The other input to NOR gate 204 is signal SB0, such that NOR gate 204 produces a high output if signal SB0 is low.

If the output of NOR gate 204 is low, then the output of NAND gate 206 is high, regardless of the state of signal OUT. A high output signal from NAND gate 206 is inverted to a low signal by inverter 212, the low signal preventing MOSFET 224 from turning on. MOSFET 224 has its drain and source nodes connected between predetermined voltage source $V_{CCIO}$ and terminal $V_{OUT}$, respectively.

A high output signal from NOR gate 204 (i.e., when signal SB0 is low) is combined with signal OUT such that NAND gate 206 acts as an inverter on the OUT signal. The signal inverted by NAND gate 206, is inverted by inverter 212 such that the signal input to the gate of MOSFET 224 is the same as that of signal OUT. Thus, if signal OUT is high, MOSFET 224 is turned on and if signal OUT is low, MOSFET 224 is turned off.

The second MOSFET which controls the output signal is MOSFET 226, which is connected between predetermined voltage source $V_{SSIO}$ and terminal $V_{OUT}$ (while it is preferable that $V_{SSIO}$ is separate from internal ground source $V_{SS}$—to reduce noise—the principles of the present invention may be practiced using a common ground). The state of MOSFET 226 is determined based upon signals SB1 and OUT. Signal OUT is inverted by inverter 208 and input to NAND gate 210, which together act as a buffer to signal OUT (that is controlled by signal ENABLE). Thus, signal OUT is provided as an input to inverter 214. The inverted signal controls MOSFET 226 such that MOSFET 226 is on when signal OUT is low, and off when signal OUT is high.

Signal SB1, which is inverted by inverter 228, drives the gate of MOSFET 232. The inverted SB1 signal determines whether transmission gate 230 passes the signal as its input (which corresponds to signal OUT). When transmission gate 230 is on, it passes signal OUT to the gate of MOSFET 234. The inverted SB1 signal is also provided as one input to NOR gate 240. The other input to NOR gate 240 is signal OUT (i.e., signal OUT, after it has been inverted twice by inverters 214 and 238). The output of NOR gate 240 drives the gate of MOSFET 242, which has a source region connected to terminal $V_{OUT}$. Signal OUT also drives the gate of MOSFET 236, such that MOSFET 236 is on when signal OUT is high.

The circuitry including inverters 228 and 238, NOR gate 240, transmission gate 230, and MOSFETs 232, 234, 236, and 242 provide noise reduction for output driver 102 during transitions of signal OUT from low to high when Select Signal SB1 is high (because when SB1 is low, NOR gate 240 always provides a low output keeping MOSFET 242 turned off—i.e., TTL and open drain).

While OUT is low, MOSFET 242 is on and MOSFET 236 is off. When OUT goes high, MOSFET 236 is immediately turned on such that MOSFETs 236 and 242 are on causing the gate and drain of MOSFET 226 to be tied together. Once the time delay introduced by inverter 236 and NOR gate 240 lapses, MOSFET 242 turns off and normal operation continues. Thus, noise is reduced during the low-to-high transition by temporarily coupling the gate and drain of MOSFET 226 together. Further, the noise reduction is only applicable during GTL/HSTL operations (i.e., when signal SB1 is high).

Figure 3:
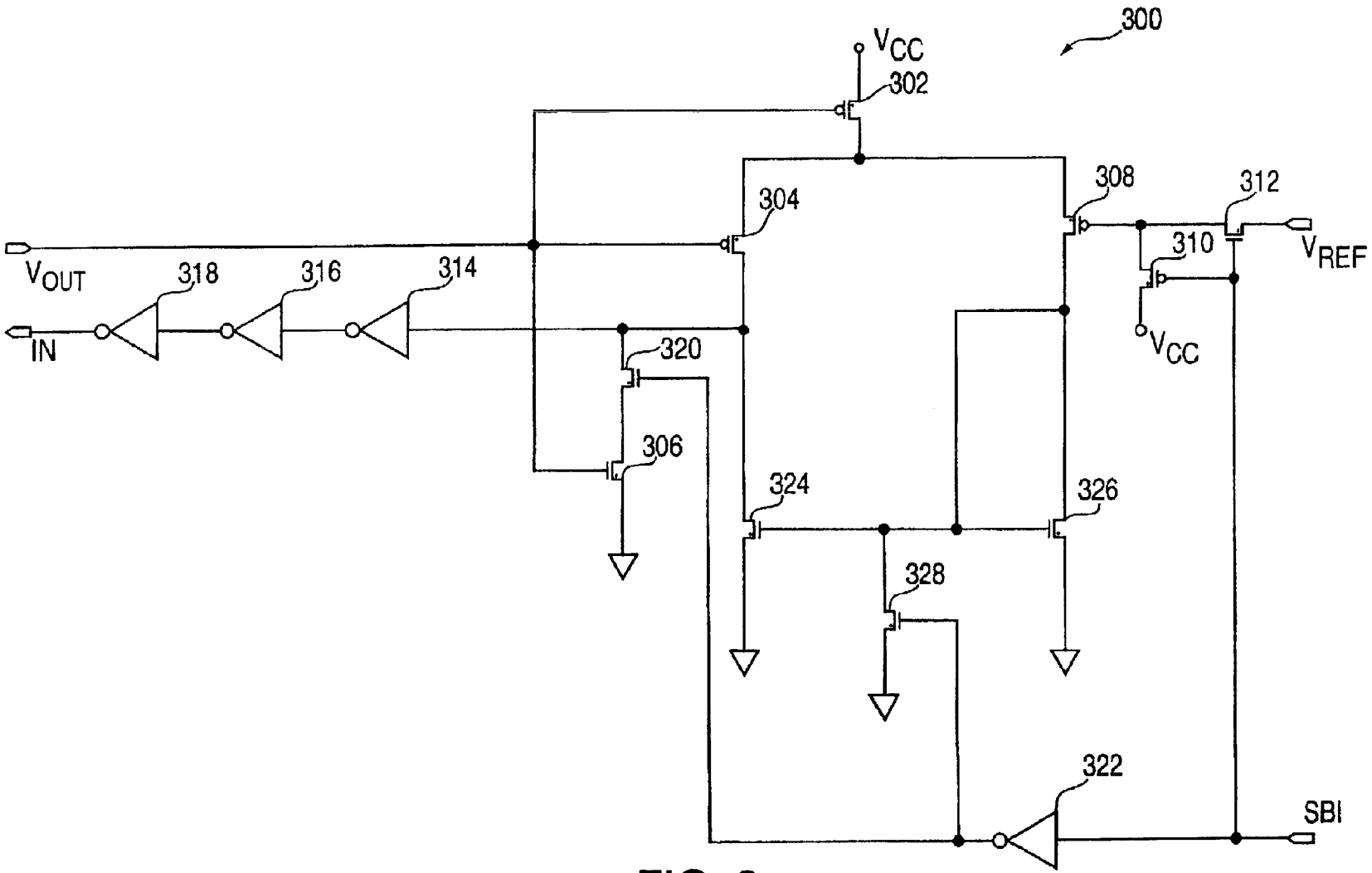
FIG. 3 is a schematic diagram of one embodiment of a programmable input buffer of the input/output circuit of FIG. 1, constructed in accordance with the principles of the present invention.

FIG. 3 shows one embodiment of input driver 104 as input driver circuit 300. Driver circuit 300 merges the TTL portion with the GTL portion to reduce transistor count and layout area. However, due to the merged circuitry, the TTL and GTL circuits may not be independently optimized. Driver circuit 300 includes p-channel MOSFETs 302 and 304, and n-channel MOSFET 306, all having a gate coupled to receive signal $V_{OUT}$ from output driver 102 to I/O pad 106. MOSFET 302 is coupled between predetermined voltage source $V_{CC}$ and one side of the source/drain channel of MOSFET 304. An additional p-channel MOSFET 308 is also coupled the source/drain channel of MOSFET 304.

The other side of the source/drain channel of MOSFET 304 is coupled to a series of inverters 314, 316, and 318, which provide signal IN to the PLD. N-channel MOSFET 320 has a source/drain channel coupled between the input of inverter 314 and MOSFET 306. The gate of MOSFET 320 is driven by inverted signal SB1 (which is inverted by inverter 322).

N-channel MOSFET 324 has a source/drain channel coupled between MOSFET 304 and ground, while n-channel MOSFET 326 is coupled between MOSFET 308 and ground, however, MOSFET 326 is diode-connected. The gates of MOSFETs 324 and 326 are coupled together and to one end of the source/drain channel of n-channel MOSFET 328, while the other end is coupled to ground. MOSFET 328 is driven by the inverted SB1 signal received from inverter 322.

P-channel MOSFET 310 and n-channel MOSFET 312 have their gates coupled together such that one of MOSFETs 310 and 312 is on at all times. The gates of MOSFETs 310 and 312 are coupled to receive signal SB1, which is the only Signal Bit utilized by input driver circuit 300. MOSFETs 310 and 312 also have their source/drain channels coupled together and to the gate of MOSFET 308 such that the gate of MOSFET 308 is always provided with one or predetermined voltages $V_{CC}$ or $V_{REF}$ ($V_{REF}$ may typically be about 0.8 volts).

MOSFETs 302, 304, 308, 324 and 326 are coupled together to form a differential amplifier. The inputs to the differential amplifier are the gates of MOSFETs 304 and 308. MOSFET 304 receives the input signal from either output buffer 102 or I/O pad 106, while MOSFET 308 receives the predetermined reference voltage. The input signal is only compared to the reference voltage by the differential amplifier when the amplifier is activated by Select Signal SB1.

When signal SB1 is high—i.e., logic standard GTL or HSTL is selected—inverter 322 provides a low signal to the gates of MOSFETs 320 and 328, turning them both off. At the same time, the high SB1 signal is provided to the gates of MOSFETs 310 and 312, which turns MOSFET 310 off (because it is a p-channel device) and MOSFET 312 on (because it is an n-channel device). MOSFET 312 provides $V_{REF}$ (which is a reference voltage, typically about 0.8 volts) to MOSFET 308, turning it on.

MOSFETs 324 and 326 are coupled together to produce a current mirror within the differential amplifier such that the current passing through MOSFETs 304 and 324 is substantially equal to the current passing through MOSFETs 308 and 326. The current mirror is turned on and off by MOSFET 328 in conjunction with signal SB1 (i.e., when SB1 is low, MOSFET 328 is turned on which grounds the gates of MOSFETs 324 and 326, effectively turning off the current mirror). Additionally, because MOSFET 320 is off when the current mirror is on (it is controlled by the same signal that controls MOSFET 328), the signal IN is directly related to the current passing through the branches of the current mirror.

However, if signal $V_{OUT}$ is higher than $V_{REF}$ when SB1 is high, the current mirror is not turned on because p-channel MOSFET 302 is off (such that the current from voltage source $V_{CC}$ does not pass into the current mirror). Because the current mirror is off, the input to inverter 314 is low. The low signal is inverted three times and supplied as a high signal to terminal IN. Three inverters are provided to enable the driver circuit to drive circuits having increased loads by sizing inverter 314 to be smaller than inverters 316 and 318. Thus, inverters 316 and 318 act to buffer and amplify the signal output from inverter 314. The smaller size of inverter 314 is used to reduce the loading at the output of the input buffer to allow it to switch faster.

On the other hand, when signal $V_{OUT}$ is lower than $V_{REF}$ and SB1 is high, MOSFET 302 is on which turns on the current mirror. A current then passes down each branch of the current mirror and provides a high input to inverter 314. The high signal is inverted three times to provide a low signal to terminal IN.

A low SB1 signal turns on MOSFET 310 which provides $V_{CC}$ to MOSFET 308, turning it off. The low SB1 signal also turns on MOSFET 328 which grounds the current mirror, and turns on MOSFET 320. MOSFET 320 acts in conjunction with MOSFET 306 to provide a current path depending on the state of signal $V_{OUT}$ When signal VOUT is high, MOSFETs 306 and 320 are on which grounds the input to inverter 314. The grounded signal is inverted three times to provide a high signal to terminal IN. When signal $V_{OUT}$ is low, MOSFETs 302 and 304 are turned on and MOSFET 306 is turned off. Thus, a high signal is input to inverter 314 which is inverted three times and provided as a low signal to terminal IN.

Operation of I/O circuit 100 may require additional settings by a user to properly program the buffer circuitry. For example, for use with the TTL/CMOS standards, $V_{CCIO}$ is typically set about 5.0 volts, which provides a high signal from about 2.4 volts to about 3.5 volts. For open drain logic, I/O pad 106 is coupled to a terminating resistor, which sets the appropriate voltage levels because MOSFET 224 is permanently off (due to signal SB0 being set high).

GTL/HSTL non-terminated logic operates in a manner similar to open drain, in that MOSFET 224 is always off. However, the input voltage levels are set by the value of the reference voltage $V_{REF}$. For GTL/HSTL terminated, the voltage levels are determined by setting $V_{CCIO}$ to be equal to the termination voltage (typically from about 1.2 volts to about 1.6 volts).

Figure 4:
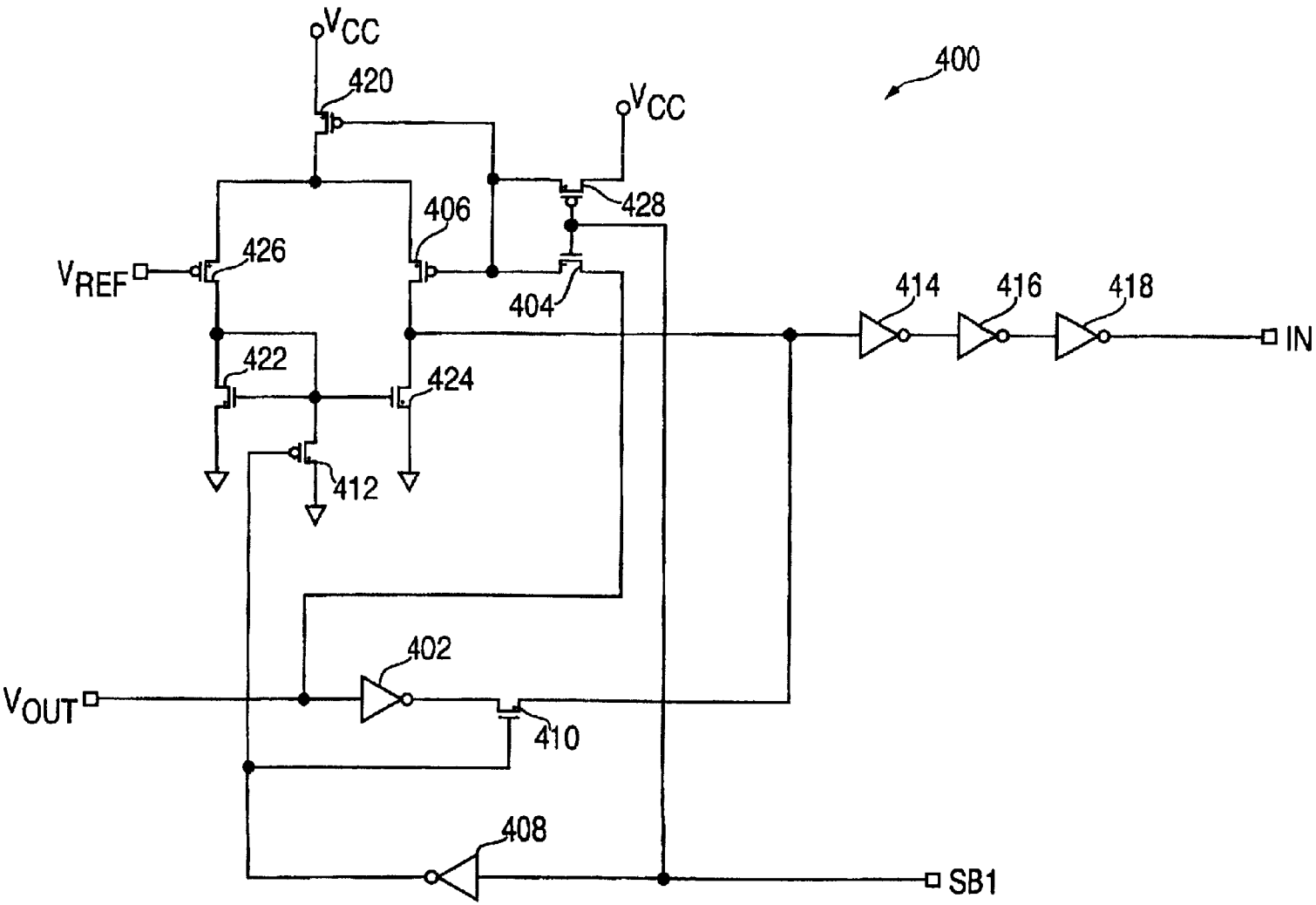
FIG. 4 is a schematic diagram of an alternate embodiment of a programmable input buffer of the input/output circuit of FIG. 1, constructed in accordance with the principles of the present invention.

FIG. 4 shows an alternate embodiment of input buffer 104 as buffer circuit 400. In buffer 400, the TTL and GTL input driving circuits are not merged, requiring higher transistor count than buffer 300. However, buffer 400 provides the capability to independently optimize the operational speed of the TTL and GTL input buffers.

Buffer circuit 400 includes inverter 402 and n-channel MOSFET 404 which are adapted to receive signal $V_{OUT}$ from output buffer 102 or I/O pad 106 MOSFET 404, which has a source connected to drive the gate of p-channel MOSFET 406, is itself driven by Select Signal SB1 (once again, the only Select Signal utilized by input buffer 104). Select Signal SB1 is also inverted by inverter 408 and provided to p-channel MOSFETs 410 and 412. MOSFET 410 connects the inverted $V_{OUT}$ signal (from inverter 402) to the input of inverter 414, which is coupled in series through inverters 416 and 418 to terminal IN.

P-channel MOSFET 420 is coupled to act as the current source for the current mirror formed by n-channel MOSFETs 422 and 424, with MOSFET 422 being diodeconnected. P-channel MOSFET 426 is coupled to mirror the characteristics of MOSFET 406, but is constantly driven on by reference voltage $V_{REF}$. Thus, the two branches of the current mirror are formed by MOSFET pairs 422/426 and 406/424.

Similarly to MOSFET 328 of FIG. 3, n-channel MOSFET 412 turns the current mirror on and off in conjunction with signal SB1 by grounding the gates of MOSFETs 422 and 424. Additionally, p-channel MOSFET 428, which is connected between reference voltage $V_{CC}$ and the gate of MOSFETs 406 and 420, keeps the current mirror turned off when SB1 is low by providing $V_{CC}$ to the gates of MOSFETs 406 and 420 to turn them off.

Buffer circuit 400 operates as follows. When signal SB1 is low, the current mirror is turned off and MOSFET 410 is turned on. Therefore, the $V_{OUT}$ signal applied by output buffer 102 or I/O pad 106 is level translated first by inverter 402 then inverted three times (by inverters 414, 416, and 418) back to its original state and provided to terminal IN (i.e., a high signal $V_{OUT}$ ends up as a high signal at terminal IN and vice versa).

When signal SB1 is high, MOSFETs 410, 412, and 428 are turned off, which terminates the direct path from terminal $V_{OUT}$ to terminal IN and turns on the current mirror. MOSFET 404, which is coupled to terminal $V_{OUT}$, is turned on to provide signal $V_{OUT}$ as a driving signal to the gate of MOSFET 406. The output of the current mirror is taken from a node between MOSFETs 406 and 424 and is coupled to the input of inverter 414.

If signal $V_{OUT}$ is lower than $V_{REF}$, MOSFETS 406 and 420 are turned on, activating the current mirror to cause a high signal to be input to inverter 414. The high signal is inverted three times to provide a low signal to terminal IN. If signal $V_{OUT}$ is higher than $V_{REF}$, MOSFETS 406 and 420 are turned off, de-activating the current mirror to cause a low signal to be input to inverter 414. The low signal is inverted three times to provide a high signal to terminal IN.

Figure 5:
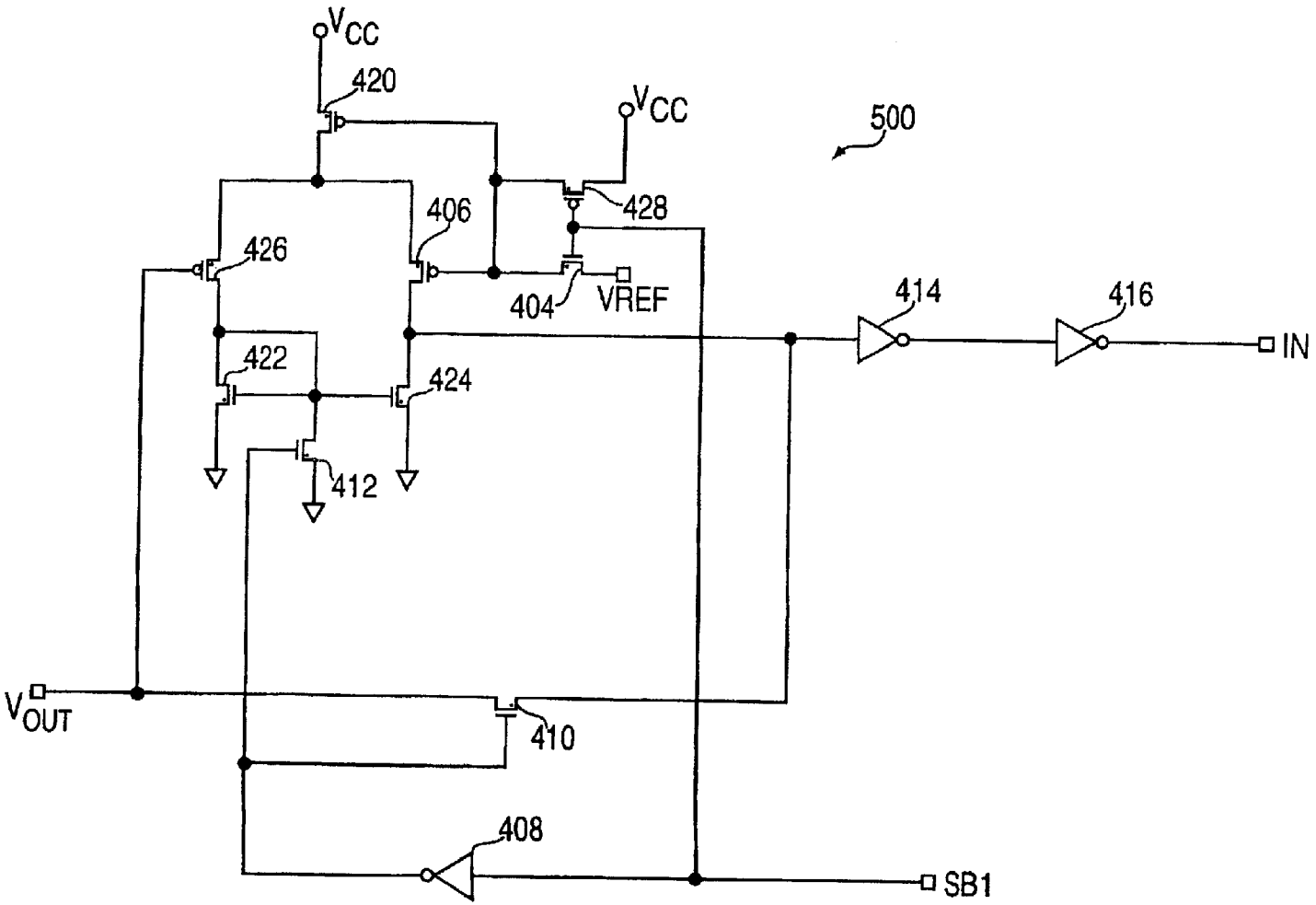
FIG. 5 is a schematic diagram of another alternate embodiment of a programmable input buffer of the input/output circuit of FIG. 1, constructed in accordance with the principles of the present invention.

FIG. 5 shows another alternate embodiment of input buffer 104 as buffer circuit 500. Buffer circuit 500 is substantially similar to buffer circuit 400 of FIG. 4, except for a slight rearrangement of input signals which enables two inverters to be eliminated. The elimination of the inverters provides a buffer circuit requiring slightly less chip area than buffer 400. However, because of the eliminated inversion stage, buffer circuit 500 may only be used to drive smaller loads than buffer circuit 400. Circuit components that are the same in buffer circuits 400 and 500 are numbered using buffer circuit 400's reference numerals. Accordingly, the discussion above for those components applies likewise to buffer circuit 500 unless otherwise described.

The differences between buffer circuits 400 and 500 are as follows. Buffer 500 is implemented without inverters 402 and 418. Thus, when the current mirror is inactive, the signal from terminal $V_{OUT}$ is only inverted twice, instead of four times, before being received by terminal IN. Additionally, because there are only two inverters in series between the current mirror and terminal IN, the current mirror must be configured to provide output signals which are inverted from the output signals of the current mirror of FIG. 4.

Whereas signal $V_{OUT}$ is supplied as an input to MOSFET 404 in buffer 400, signal $V_{OUT}$ is provided as an input to MOSFET 426 in buffer 500 (i.e., the opposing branch of the current mirror). Additionally, reference voltage $V_{REF}$, which constantly drives MOSFET 426 on in buffer 400, is instead provided as the input to MOSFET 404 in buffer 500. The switching of signal $V_{OUT}$ and $V_{REF}$ changes the operation of the current mirror as follows.

When signal SB1 is low, the only operational difference between buffers 400 and 500 is that signal $V_{OUT}$ is only inverted twice, because the current mirror remains off. However, when signal SB1 is high in buffer 500, MOSFET 428 is turned off and MOSFETs 404, 406 and 420 are turned on, which turns on the current mirror (MOSFETs 406 and 420 are turned on by $V_{REF}$ which passes through MOSFET 404). Further, when signal $V_{OUT}$ is higher than $V_{REF}$ in buffer 500, MOSFET 426 is turned off so that no current is passed by the current mirror. Therefore, the current mirror outputs a high signal which is inverted twice and passed to terminal IN. When signal $V_{OUT}$ is lower than $V_{REF}$ in buffer 500, MOSFET 426 is turned on and the current mirror outputs a low signal which is inverted twice and passed to terminal IN.

Thus, a programmable logic device having a programmable logic circuit to select any one of several different logic drivers is provided. One skilled in the art will appreciate that the present invention can be practiced by other than the described embodiment, which is presented for purposes of illustration and not of limitation. For example, while the detailed schematics of the input buffers and output buffer show specific configurations of n-channel and p-channel MOSFETs, the principles of the present invention may be practiced using n-channel MOSFETs for p-channel MOSFETs and vice versa with a slight adjustment of signal inputs and outputs. Thus, the present invention is limited only by the claims which follow.

What is claimed is:

[1. A programmable input/output device for coupling a programmable logic device (PLD) to external circuitry, the input/output device comprising:

an input/output pad;

an output buffer adapted to receive output signals from the PLD, the output buffer modifying the output signals and being coupled to the input/output pad;

an input buffer adapted to receive input signals from the input/output pad and from the output buffer, the input buffer modifying the input signals and being coupled to the PLD to provide the PLD with the modified input signals; and a plurality of logic standards; and a plurality of programmable logic elements that select a logic standard from said plurality of logic standards with which the output buffer and the input buffer respectively modify the output and input signals.]

[2. The programmable input/output device of claim 1, wherein the plurality of programmable logic elements comprises:

a first programmable logic element coupled to the output buffer and the input buffer; and a second programmable logic element coupled to the output buffer.]

[3. The programmable input/output device of claim 2, wherein the plurality of programmable logic elements are SRAM elements.]

[4. The programmable input/output device of claim 2, wherein the plurality of programmable logic elements are EPROM elements.]

[5. The programmable input/output device of claim 2, wherein the plurality of programmable logic elements are EEPROM elements.]

[6. The programmable input/output device of claim 2, wherein the plurality of programmable logic elements are antifuse elements.]

[7. The programmable input/output device of claim 2, wherein the plurality of programmable logic elements are elements from the group of SRAM, EPROM, EEPROM, and antifuse elements.]

[8. The programmable input/output device of claim 1, wherein the input/output device provides signal modification in accordance with TTL standards.]

[9. The programmable input/output device of claim 1, wherein the input/output device provides signal modification in accordance with CMOS logic standards.]

[10. The programmable input/output device of claim 1, wherein the input/output device provides signal modification in accordance with open drain logic standards.]

[11. The programmable input/output device of claim 1, wherein the input/output device provides signal modification in accordance with GTL standards.]

[12. The programmable input/output device of claim 1, wherein the input/output device provides signal modification in accordance with HSTL standards.]

[13. The programmable input/output device of claim 12, wherein the HSTL standard is terminated.]

[14. The programmable input/output device of claim 12, wherein the HSTL standard is non-terminated.]

[15. The programmable input/output device of claim 1, wherein the input buffer comprises:

a differential amplifier circuit being adapted to receive the input signals;

control circuitry that controls the modification of the input signals in accordance with the standard selected by the plurality of programmable logic elements; and inversion circuitry that provides the modified input signals to the PLD.]

[16. The programmable input/output device of claim 15, wherein the differential amplifier circuit and the control circuit operate in conjunction with each other to provide the modifications of the input signals in accordance with a plurality of logic standards.]

[17. The programmable input/output device of claim 15, wherein the differential amplifier circuit and the control circuit operate independent of each other such that the modifications of the input signals are performed by the control circuitry in accordance with a first logic standard and by the differential amplifier circuit in accordance with a second logic standard, the first and second logic standards being selected by the plurality of programmable logic elements.]

[18. The programmable input/output device of claim 17, wherein the control circuitry is optimized for speed to provide modification in accordance with the first logic standard at increased speed.]

[19. The programmable input/output device of claim 17, wherein the differential amplifier circuit is optimized for speed to provide modification in accordance with the second logic standard at increased speed.]

[20. The programmable input/output device for coupling a programmable logic device (PLD) to external circuitry, the input/output device comprising:

means for coupling the input/output device to the external circuitry;

means for receiving output signals from the PLD and for modifying the output signals in accordance with a selected logic standard, the means for receiving providing the modified output signals to the means for coupling;

means for modifying input signals received from the means for receiving and the means for coupling in accordance with the selected logic standard, the means for modifying providing the modified input signals to the PLD; and means for selecting the selected logic standard from a plurality of logic standards.]

[21. The programmable input/output device of claim 20, wherein the means for receiving comprises:

circuitry for modifying the output signals to an appropriate high voltage level in accordance with the selected logic standard if the output signals are logic high signals; and circuitry for modifying the output signals to an appropriate low voltage level in accordance with the selected logic standard if the output signals are logic low signals.]

[22. The programmable input/output device of claim 21, wherein the selected logic standard is TTL, the appropriate high signal is about 2.4 volts, and the appropriate low signal is about 0.4 volts.]

[23. The programmable input/output device of claim 21, wherein the selected logic standard is GTL, the appropriate high signal is about 1.2 volts, and the appropriate low signal is about 0.8 volts.]

[24. The programmable input/output device of claim 21, wherein the selected logic standard is CMOS, the appropriate high signal is about 3.5 volts, and the appropriate low signal is about 0 volts.]

[25. The programmable input/output device of claim 21, wherein the selected logic standard is open drain, the appropriate high signal is determined by external circuitry, and the appropriate low signal is less than about 0.4 volts.]

[26. The programmable input/output device of claim 21, wherein the selected logic standard is terminated HSTL, the appropriate high signal is determined by external circuitry, and the appropriate low signal is about equal to the appropriate high signal minus 0.1 volts.]

[27. The programmable input/output device of claim 21, wherein the selected logic standard is non-terminated HSTL, the appropriate high signal is about equal to a predetermined reference voltage plus 0.1 volts, and the appropriate low signal is about equal to the predetermined reference voltage minus 0.1 volts.]

[28. The programmable input/output device of claim 20, wherein the means for modifying comprises:

a first conversion circuit for converting the input signals in accordance with a first logic standard; and a second conversion circuit for converting the input signals in accordance with a second logic standard.]

[29. The programmable input/output device of claim 28, wherein the first and second conversion circuits are merged into a single conversion circuit.]

[30. The programmable input/output device of claim 28, wherein the first and second conversion circuits are substantially independent of each other such that they may be independently optimized for operational speed improvements.]

[31. A method for providing a programmable logic device (PLD) with the capability of being selectively coupled to external circuitry which operates in accordance with a selected one of a plurality of logic standards, the methods comprising the steps of:

programmably selecting the selected one of a plurality of logic standards;

modifying output signals from the PLD in accordance with the selected logic standard such that high PLD signals correspond to high signals of the selected standard and low PLD signals correspond to low signal of the selected standard;

receiving input signals from an external interface; and modifying the input signals in accordance with the selected logic standard such that high input signals are converted to high PLD signals and low input signals are converted to low PLD signals.]

[32. The method of claim 31, wherein the step of programmably selecting the selected one of a plurality of logic standards selects a logic standard from the group including: TTL, CMOS logic, open drain logic, GTL, terminated HSTL, and non-terminated HSTL.]

[33. The method of claim 31, wherein the step of programmably selecting comprises the step of applying a plurality of Select Bits to a plurality of programmable elements.]

[34. The method of claim 33, wherein the programmable elements are from the group including: SRAM, EPROM, EEPROM, and anti-fuse elements.]

*35. A programmable input/output device for coupling a programmable logic device (PLD) to external circuitry, the input/output device comprising:*

*an input/output pad;*

*an output buffer adapted to receive output signals from the PLD, the output buffer modifying the output signals and being coupled to the input/output pad;*

*an input buffer adapted to receive a reference signal and input signals from the input/output pad and from the output buffer, the input buffer comparing the received input signals to the reference signal to produce a differential signal and coupling the differential signal to the PLD to provide the PLD with modified input signals; and*

*a plurality of programmable elements that select the standard with which the output buffer and the input buffer respectively modify the output and input signals.*

*36. The programmable input/output device of claim 35, wherein the plurality of programmable elements further comprise:*

*a first programmable element coupled to the output buffer and the input buffer; and*

*a second programmable element coupled to the output buffer.*

*37. The programmable input/output device of claim 36, wherein the plurality of programmable elements are elements selected from the group consisting of SRAM, EPROM, EEPROM, fuse and antifuse elements.*

*38. The programmable input/output device of claim 35, wherein the input/output device provides signal modification in accordance with logic standards selected from the group consisting of TTL, CMOS, GTL, and HSTL.*

*39. The programmable input/output device of claim 35, wherein the input buffer comprises:*

*a differential amplifier circuit being adapted to receive the input signals;*

*control circuitry that controls the modification of the input signals in accordance with the standard selected by the plurality of programmable elements; and*

*inversion circuitry that provides the modified input signals to the PLD.*

*40. The programmable input/output device of claim 39, wherein the differential amplifier circuit and the control*

*circuit operate in conjunction with each other to provide the modifications of the input signals in accordance with a plurality of logic standards.*

*41. The programmable input/output device of claim 39, wherein the differential amplifier circuit and the input buffer operate independent of each other such that the modifications of the input signals are performed by the input buffer in accordance with a first logic standard and by the differential amplifier circuit in accordance with a second logic standard, the first and second logic standards being selected by the plurality of programmable elements.*

*42. The programmable input/output device of claim 41, wherein the input buffer is optimized for speed to provide modification in accordance with the first logic standard at increased speed.*

*43. The programmable input/output device of claim 41, wherein the differential amplifier circuit is optimized for speed to provide modification in accordance with the second logic standard at increased speed.*

*44. A programmable input/output device for coupling a programmable logic device (PLD) to external circuitry, the input/output device comprising:*

*means for coupling the input/output device to the external circuitry;*

*means for receiving output signals from the PLD and for modifying the output signals in accordance with a selected logic standard, the means for receiving providing the modified output signals to the means for coupling;*

*means for modifying input signals received from the means for receiving and the means for coupling in accordance with the selected logic standard, the means for modifying including a means for comparing the received input signals to a reference signal to produce a differential signal and for providing the modified input signals to the PLD; and*

*means for selecting the selected logic standard from a plurality of logic standards.*

*45. The programmable input/output device of claim 44, wherein the means for receiving comprises:*

*circuitry for modifying the output signals to an appropriate high voltage level in accordance with the selected logic standard if the output signals are logic high signals; and*

*circuitry for modifying the output signals to an appropriate low voltage level in accordance with the selected logic standard if the output signals are logic low signals.*

*46. The programmable input/output device of claim 44, wherein the means for modifying comprises:*

*a first conversion circuit for converting the input signals in accordance with a first logic standard; and*

*a second conversion circuit for converting the input signals in accordance with a second logic standard.*

*47. The programmable input/output device of claim 46, wherein the first and second conversion circuits are merged into a single conversion circuit.*

*48. The programmable input/output device of claim 46, wherein the first and second conversion circuits are substantially independent of each other such that they may be independently optimized for operational speed improvements.*

*49. A method for providing a programmable logic device (PLD) with the capability of being selectively coupled to external circuitry that operates in accordance with a selected one of a plurality of logic standards, the method comprising:*

*programmably selecting the selected one of a plurality of logic standards;*

*modifying output signals from the PLD in accordance with the selected logic standard such that high PLD signals correspond to high signals of the selected standard and low PLD signals correspond to low signal of the selected standard;*

*receiving input signals from an external interface;*

*comparing the received input signals to a reference signal to produce a differential signal in accordance with the selected logic standard such that high input signals are converted to high PLD signals and low input signals are converted to low PLD signals.*

*50. The method of claim 49, wherein the programmably selecting further comprises selecting a logic standard selected from the group consisting of TTL, CMOS, open drain logic, GTL, terminated HSTL, and non-terminated HSTL.*

*51. The method of claim 49, wherein the programmably selecting further comprises applying a plurality of Select Bits to a plurality of programmable elements.*

*52. A programmable input/output device capable of operating at multiple logic standards comprising:*

*an input/output terminal;*

*a plurality of programmable elements; and*

*an input buffer having circuitry controlled by at least one of the plurality of programmable elements to select between a first logic standard and a second logic standard wherein the second logic standard is a differential logic standard.*

*53. The programmable input/output device of claim 52 wherein the differential logic standard is a standard selected from the group consisting of HSTL and GTL.*

*54. The programmable input/output device of claim 52 wherein the first logic standard is a standard selected from the group consisting of TTL or CMOS.*

*55. The programmable input/output device of claim 52 wherein the programmable elements are elements selected from the group consisting of SRAM, EPROM, EEPROM, and antifuse elements.*

*56. The programmable input/output device of claim 52 wherein the input buffer further comprises a differential amplifier circuit that is used for generating the differential logic standard.*

*57. The programmable input/output device of claim 52 wherein at least one programmable element is coupled to the input buffer.*

*58. The programmable input/output device of claim 52 further comprising an output buffer having circuitry controlled by at least one of the plurality of programmable elements to select between the first logic standard and the second logic standard.*

*59. The programmable input/output device of claim 58 wherein the second logic standard is a differential logic standard.*

*60. The programmable input/output device of claim 58 wherein at least one programmable element is coupled to the input buffer.*

*61. The programmable input/output device of claim 60 wherein the input buffer and the output buffer are controlled by the same programmable element.*

*62. A programmable input/output buffer capable of operating at multiple logic standards comprising:*

*an input/output terminal;*

*a plurality of programmable elements; and*

*an output buffer having circuitry controlled by at least one of the plurality of programmable elements to select between one logic standard and a differential logic standard.*

*63. The programmable input/output device of claim 62 wherein the differential logic standard is a standard selected from the group consisting of HSTL and GTL.*

*64. The programmable input/output device of claim 62 wherein the first logic standard is a standard selected from the group consisting of TTL and CMOS.*

*65. The programmable input/output device of claim 62 wherein the programmable elements are elements selected from the group consisting of SRAM, EPROM, EEPROM, and antifuse elements.*

*66. The programmable input/output device of claim 62 wherein at least one programmable element is coupled to the output buffer.*

*67. The programmable input/output device of claim 62 further comprising an input buffer having circuitry controlled by at least one of the plurality of programmable elements to select between the first logic standard and the second logic standard.*

*68. The programmable input/output device of claim 67 wherein the second logic standard is a differential logic standard.*

*69. The programmable input/output device of claim 67 wherein at least one programmable element is coupled to the output buffer.*

*70. The programmable input/output device of claim 69 wherein the input buffer and the output buffer are controlled by the same programmable element.*

*71. A programmable input/output device comprising:*

*an input/output terminal;*

*an input buffer and an output buffer coupled to the input/output terminal, each of which includes means for modifying signals applied to the input/output terminal to a selected one of multiple logic standards wherein at least one of the multiple logic standards is a differential logic standard; and*

*a plurality of programmable elements for selecting the logic standard at which the input and output buffers operate.*

*72. The programmable input/output device of claim 71 wherein the input buffer and the output buffer further comprise means for modifying signals applied to the input/output terminal to a logic standard selected from the group consisting of TTL, CMOS, GTL and HSTL.*

*73. The input/output device of claim 71, wherein the input buffer and the output buffer share at least one programmable element.*

* * * * *